United States Patent

Ohuchi et al.

[11] Patent Number: 5,999,413
[45] Date of Patent: *Dec. 7, 1999

[54] RESIN SEALING TYPE SEMICONDUCTOR DEVICE

[75] Inventors: Shinji Ohuchi; Noritaka Anzai, both of Tokyo, Japan

[73] Assignee: Oki Electric Industry Co., Ltd., Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/990,790

[22] Filed: Dec. 15, 1997

[30] Foreign Application Priority Data

Jan. 20, 1997 [JP] Japan ..................... 9-007519
Oct. 7, 1997 [JP] Japan ..................... 9-274392

[51] Int. Cl.⁶ ............... H01L 23/48; H01L 23/10
[52] U.S. Cl. ............ 361/772; 361/783; 361/813; 257/684; 257/730; 257/737; 257/738; 257/786; 257/787; 174/52.1; 174/52.2; 174/52.3; 174/52.4; 174/260; 438/127
[58] Field of Search ..................... 361/772–774, 361/783, 813; 257/673, 676, 684, 692, 693, 697, 704, 730, 737, 738, 786, 787; 438/124, 126, 127, 613, 615; 174/52.1–52.4, 260

[56] References Cited

U.S. PATENT DOCUMENTS

| | | | |
|---|---|---|---|
| 5,045,921 | 9/1991 | Lin et al. | 257/680 |
| 5,222,014 | 6/1993 | Lin | 361/792 |
| 5,273,938 | 12/1993 | Lin et al. | 438/792 |
| 5,384,689 | 1/1995 | Shen | 361/761 |
| 5,474,958 | 12/1995 | Djennes et al. | 257/676 |
| 5,572,066 | 11/1996 | Safai et al. | 257/676 |
| 5,639,695 | 6/1997 | Jones et al. | 438/126 |
| 5,677,566 | 10/1997 | King et al. | 257/692 |
| 5,693,572 | 12/1997 | Bond et al. | 438/126 |
| 5,729,051 | 3/1998 | Nakamura | 257/697 |
| 5,744,827 | 4/1998 | Jeong et al. | 257/692 |
| 5,777,382 | 7/1998 | Abbott et al. | 257/738 |
| 5,786,239 | 7/1998 | Ohsawa et al. | 438/124 |

*Primary Examiner*—Leo P. Picard
*Assistant Examiner*—John B. Vigushin
*Attorney, Agent, or Firm*—Jones Volentine, LLP

[57] ABSTRACT

A resin sealing type semiconductor device capable of making a resin burr hard to occur when formed by molds and of restraining cracks in solder, is actualized by providing a stepped portion on a resin sealing body for covering a circuit forming surface of a semiconductor chip, making leads exposed from this exposed surface and joining solder bumps to the leads.

24 Claims, 7 Drawing Sheets

RESIN SEALING TYPE SEMICONDUCTOR DEVICE

BACKGROUND OF THE INVENTION

The present invention relates generally to a semiconductor device and, more particularly, to a structure of the semiconductor device of a resin sealing type known as a chip scale package in which leads are provided within a size of a semiconductor chip.

With advancements of an IC card (an integrated circuit) and a memory card, semiconductor devices incorporated into these cards have been required to be reduced both in thickness and in size. A chip scale package has been developed to meet those demands, and is contrived to downsize the whole by accommodating leads connected to a circuit forming surface of a semiconductor chip within a size of the chip as well as to reduce the thickness by forming a sealing resin layer in such a form that a reverse surface to the circuit forming surface is exposed.

FIGS. 6a and 6b are structural views illustrating a resin sealing type semiconductor device of the prior art chip scale package. FIG. 6a is a perspective view showing an external appearance thereof. FIG. 6b is an enlarged sectional view taken along the line A—A in FIG. 6a. This semiconductor device includes a semiconductor chip 1, and a plurality of electrodes 2 are formed at a central portion of a circuit forming surface 1a serving as one surface thereof.

A lead 4 is a thin metal plate crooked at two points. The lead 4 has a electrode connecting portion 4a bonded to the circuit forming surface 1a at the central portion of the circuit forming surface 1a through an adhesive tape 3 exhibiting an insulating property, an external connecting portion 4b formed with a step substantially in parallel to the connecting portion 4a, and an inclined middle portion 4c for connecting the electrode connecting portion 4a to the external connecting portion 4b. The electrode connecting portion 4a of the lead 4 is electrically connected to the electrode 2 via a metal wire 5. The external connecting portion 4b is disposed at a predetermined interval with respect to the circuit forming surface 1a.

The circuit forming surface 1a of the semiconductor chip 1 and the peripheral side surface are sealed with a sealing resin layer 6 formed by molding in a state where only the external connecting portion 4b of the lead 4 is exposed. On the other hand, a reverse surface 1b opposite to the circuit forming surface 1a of the semiconductor chip 1 is not covered with the sealing resin layer 6 and is in a state of being exposed.

The thus constructed semiconductor device is manufactured by, e.g., the following processes.

To start with, the lead 4 of a molded lead frame is bonded to the circuit forming surface 1a of the semiconductor chip 1 by use of the adhesive tape 3, and thereafter the electrode connecting portion 4a of this lead 4 is electrically connected to the electrode 2 on the semiconductor chip 1 through bonding of the metal wire 5. The electrode connecting portion 4a is silver-plated for wire bonding when manufacturing the lead frame.

Next, the semiconductor chip 1 is mounted into a bottom mold for molding in such a state that the lead frame is bonded. At this time, the semiconductor chip 1 is mounted so that the reverse surface 1b of the semiconductor chip 1 comes into contact with a bottom portion of the bottom mold for molding while a frame member of the lead frame is positioned in a predetermined place in a frame of the bottom mold. Further, the bottom mold into which the semiconductor chip 1 is mounted, is covered with a top mold paired with this bottom mold, and a liquid mold resin is poured into the molds from a gate.

After the mold resin has been hardened, the semiconductor chip molded by the sealing resin layer 6 is taken out of the molds, and an unnecessary portion of the lead frame is cut off. Then, the external connecting portion 4b of the lead 4 is silver-plated for soldering, thus completing the semiconductor device.

When the thus constructed semiconductor device is packaged on the printed-circuit board, cream solder is coated by screen printing etc over a foot print on a parts mounting surface of the printed-circuit board. Then, the semiconductor device is mounted so that the external connecting portion 4b of the lead 4 comes into contact with an upper area of the cream solder. The mounted semiconductor device is put into a reflow device and heated at approximately 300° C. enough to melt the cream solder, thereby soldering the semiconductor device to the printed-circuit board.

There arise, however, mainly two problems, as shown in FIGS. 7a and 7b, inherent in the conventional resin sealing type semiconductor device. A first problem is that the mold resin is forced out onto a part of the external connecting portion 4b of the lead 4 of the semiconductor device when in the molding process, resulting in a production of a so-called resin burr 7 illustrated in a perspective view of FIG. 7a. When the lead frame is mounted into the molds, the external connecting portion 4b of the lead 4 comes into a state of floating within a cavity, and there is no contrivance to press it against an internal upper surface of the top mold. Therefore, an adhesion to the top mold is weak, and there might be a high possibility in which the mold resin poured into the molds permeates between the external connecting portion 4b and the internal upper surface of the top mold, thereby producing the resin burr 7. The resin burr 7 hinders the semiconductor device from being soldered to the printed-circuit board, and hence there is a necessity for removing the resin burr 7 by a contrivance such as, e.g., flushing the burrs away by high-pressure water before being packaged on the printed-circuit board. This conduces to a problem of increasing the number of processes therefor.

Moreover, concomitantly with the first problem, the prior art resin sealing type semiconductor device has a problem of requiring two plating processes with respect to the lead 4 before and after forming the sealing resin layer 6. More specifically, if the resin burr 7 is produced, as described above, the process of removing this burr is needed, and hence the silver plating for soldering, which is effected on the external connecting portion 4b, is required to be executed after the process of removing the resin burr 7. While on the other hand, it is required that the silver plating for wire bonding with respect to the electrode connecting portion 4a be executed when manufacturing the lead frame.

A second problem is that a crack 11 tends to be caused in the solder 10 for a connection to a foot print 9 on a printed-circuit board 8 as illustrated in FIG. 7b showing a packaged state of the semiconductor device on the printed-circuit board. The crack is derived from a brittle fracture in the solder 10, which is caused in such a process that if used in an environment where the temperature fluctuates wildly after being packaged on the printed-circuit board, or when cooled down to a normal temperature after being heated by the reflow device, a stress is applied upon the solder 10 due to a difference in terms of thermal expansion coefficient between the sealing resin layer 6 and the printed-circuit board 8. If the crack 11 is produced in the solder 10, there arises a problem in which a mechanical connecting strength between the printed-circuit board 8 and the semiconductor device decreases, and the electrical connection becomes unstable.

Accordingly, it is a primary object of the present invention, which was contrived in view of the above problems inherent in the prior art, to provide a resin sealing type semiconductor device capable of making a resin burr hard to occur when in a molding process and preventing cracks from being produced in solder.

SUMMARY OF THE INVENTION

To accomplish the above object, a resin sealing type semiconductor device according to the present invention comprises a semiconductor chip including a plurality of electrodes formed at a central portion of a circuit forming surface, and a plurality of leads bonded to the circuit forming surface by a bonding layer having an insulating property, and disposed in a state of being parallel to the circuit forming surface so that their one ends serving as electrode connecting portions are located at the central portion of the circuit forming surface and that their other ends serving as external connecting portions are located at an outer edge of the circuit forming surface. This semiconductor device also comprises connecting members for electrically connecting the electrode connecting portions of the plurality of leads to the plurality of electrodes, a sealing resin layer formed by molds so as to cover the plurality of leads, the circuit forming surface and the connecting members in such a state that exposed surfaces of the external connection portions which are opposite to the circuit forming surface are exposed to the outside, and including protruded portions each protruded by one step from the exposed surface at the central portion of the circuit forming surface, and a bump formed on each of the exposed surfaces at a height higher by a fixed dimension than the protruded portion of the sealing resin layer.

According to the construction described above, the internal circuit on the semiconductor chip is electrically connected to the bumps through the connecting portions and the leads, and the bumps are connected to the wires of the printed-circuit board, whereby signals can be input and output to the external circuit disposed on the printed-circuit board.

Further, the resin sealing type semiconductor device having the above construction is manufactured by sequentially executing a process of bonding the lead by providing a bonding layer in a peripheral portion of the circuit forming surface of the semiconductor chip, a process of respectively electrically connecting the electrode connecting portion of the lead to the electrode on the semiconductor chip through the connecting member, a process of molding the sealing resin layer so as to cover the plurality of leads, the circuit forming surface and the connecting members in such a state that the semiconductor chip with a completion of the above two processes is mounted into the molds for molding, and a surface of the external connecting portion that is opposite to the circuit forming surface is exposed, and a process of forming bumps on the respective exposed surfaces of the plurality of leads.

The bonding layer may involve the use of an adhesive tape having an insulating property. Further, the connecting member may involve the use of a bonding wire. The exposed surface of the external connecting portion of the lead may be formed with a recessed portion into which the bump is fixed.

In this case, it is desirable that an internal surface of the recessed portion be subjected to metal plating for soldering.

The bumps may be arranged in one line along a stepped portion defined as a rising portion from the exposed surface of the protruded portion. In this case, the bumps may be disposed so as to be contiguous to the stepped portion of the sealing resin layer. In accordance with one embodiment, the sealing resin layer is formed so that the stepped portion takes a substantially plane configuration. Further, in accordance with another embodiment, the stepped portions of the sealing resin layer are formed to provide a repetitive layout of recessed and protruded portions so that the areas of the stepped portions which cover the plurality of leads recede toward the central side of the circuit forming surface from other areas.

Further, a resin sealing type semiconductor device according to the present invention in a state of being fixed to a printed-circuit board, comprises a semiconductor chip including a plurality of electrodes formed at a central portion of a circuit forming surface facing to the printed-circuit board, a plurality of tabular band-like leads electrically connected respectively to the plurality of electrodes, and disposed in a state of being substantially parallel to the circuit forming surface, a sealing resin layer formed so as to cover some portions of the plurality of respective leads and the circuit forming surface, and including protruded portions each so formed as to be contiguous to the printed-circuit board while protruding by one step from the lead at the center of the circuit forming surface, and a plurality of bumps for respectively connecting the exposed surfaces of the leads that are exposed from the sealing resin layer to circuit patterns of the printed-circuit board.

BRIEF DESCRIPTION OF THE DRAWINGS

Other objects and advantages of the present invention will become apparent during the following discussion in conjunction with the accompanying drawings, in which.

DESCRIPTION OF THE PREFERRED EMBODIMENTS

Figure 1A:
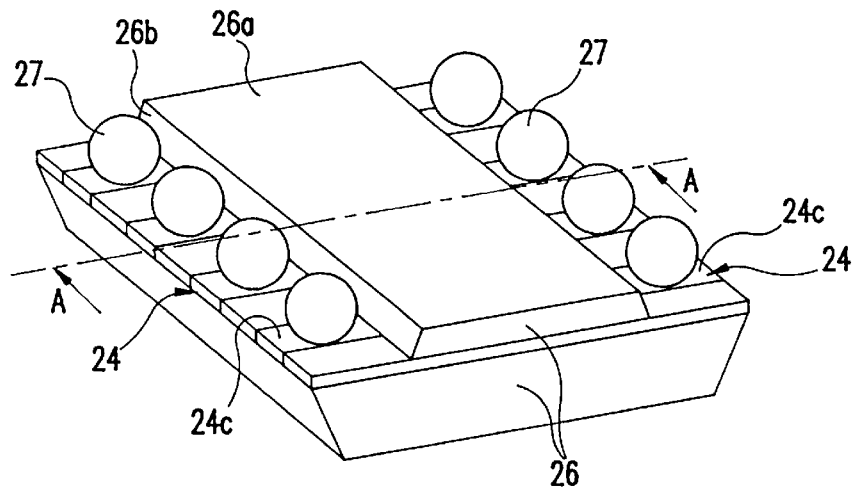
FIG. 1*a* is a perspective view showing a resin sealing type semiconductor device in a first embodiment of the present invention.
Figure 1B:
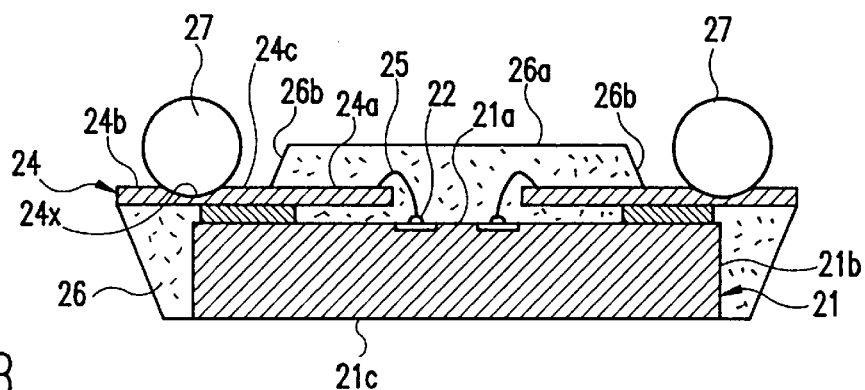
FIG. 1*b* is a sectional view taken along the line A—A in FIG. 1*a*.

Embodiments of a resin sealing type semiconductor device according to the present invention will hereinafter be described. FIGS. 1a and 1b are views of a structure of the resin sealing type semiconductor device, showing a first embodiment of the present invention. FIG. 1a is a perspective view illustrating an external appearance thereof. FIG. 1b is a sectional view taken along the line A—A in FIG. 1a.

The resin sealing type semiconductor device in the first embodiment includes a semiconductor chip 21 assuming a configuration of rectangular parallelopiped, and a plurality of electrodes 22 for connecting an internal circuit of the semiconductor chip 21 to the outside, are formed at the central portion of a circuit forming surface 21a serving as one surface of the chip 21. Totally eight pieces of the electrodes 22 are arranged by fours in two lines in the longitudinal direction of the circuit forming surface 21 in the first embodiment.

Insulating adhesive tapes 23, which are each approximately 0.8 mm in width, are provided as adhesive layers extending in the longitudinal direction along peripheral portions of the circuit forming surface 21a. The adhesive tape 23 is constructed such that both surface of its base composed of, e.g., polyimide which is approximately 50 μm in thickness are respectively coated with a thermoplastic resin in thickness of approximately 25 μm. Then, a plurality of leads 24 each taking a tabular band-like shape are bonded to the circuit forming surface 21a through these adhesive tapes 23. The lead 24 is so provided as to show a one-to-one correspondence to the electrode 22. Accordingly, in this embodiment, totally eight pieces of leads-four leads on each side-are bonded.

The lead 24 is a lead-out wire for an electrical and mechanical connection when the semiconductor device is packaged on a printed-circuit board, and is a metal plate composed of a material such as, e.g., Fe—Ni alloy etc and having a thickness of approximately 0.1 mm and a width of approximately 1 mm. The lead in the embodiment is not protruded long outwardly of the semiconductor chip as in the case of a pin in a prior art flat package etc but is cut to such a length as to be accommodated in the plane of the circuit forming surface 21a in order to downsize the semiconductor device itself.

The lead 24 is disposed in parallel to the circuit forming surface 21a so that an electrode connecting portion 24a serving as one end thereof is located at the central portion of the circuit forming surface 21a while an external connecting portion serving as the other end thereof is located at an outer edge of the circuit forming surface 21a. Metal plating such as silver plating for soldering is effected over the surface (an upper surface in FIG. 1b) of the electrode connecting portion 24a, which surface is opposite to the circuit forming surface 21a, whereby the plated portion of the electrode connecting portion 24a is electrically connected to the electrode 22 through a bonding wire (a connecting member) 25 such as a gold wire etc.

Further, a sealing resin layer 26 composed of epoxy resin etc is formed by molding so as to cover the circuit forming surface 21a and a side surface 21b of the semiconductor chip 21, the bonding wires 25 and the electrode connecting portions 24a. An exposed surface 24c, opposite to the circuit forming surface 21a, of the external connecting portion 24b, and a reverse surface 21c opposite to the circuit forming surface 21a of the semiconductor chip 21, are not sealed with the sealing resin layer 26 but are exposed to the outside. The sealing resin layer 26 includes a protruded portion 26a protruded by one step from the exposed surface 24c of the lead 24 at the central portion of the circuit forming surface 21a. A rising portion of this protruded portion 26a from the exposed surface 24c of the lead 24, is defined as a stepped portion 26b of the sealing resin layer. In the first embodiment, the stepped portion 26b is formed in a configuration of plane surface.

The exposed surface 24c of the lead 24 is formed with recessed portions 24x each having a diameter of, e.g., approximately 0.2 mm and a depth of approximately 40 μm, and internal surface of these recessed portions 24x are metal-plated such as silver plating for soldering. Each of the recessed portions 24x of the respective leads 24 is formed with a solder bump 27. The solder bump 27 is fixed to the lead 24 at such a height that the solder bump 27 is higher by a fixed dimension than the protruded portion 26a of the sealing resin layer 26 formed covering the circuit forming surface 21a. For example, if a height of the sealing resin layer 26 from the lead 24 is approximately 0.15 mm, the height of the solder bump 27 is approximately 0.5 mm. In accordance with the first embodiment, the solder bumps 27 are rectilinearly arranged at a fixed distance from the respective stepped portions 26b of the sealing resin layer 26 on both sides of the protruded portion 26a.

Figure 1C:
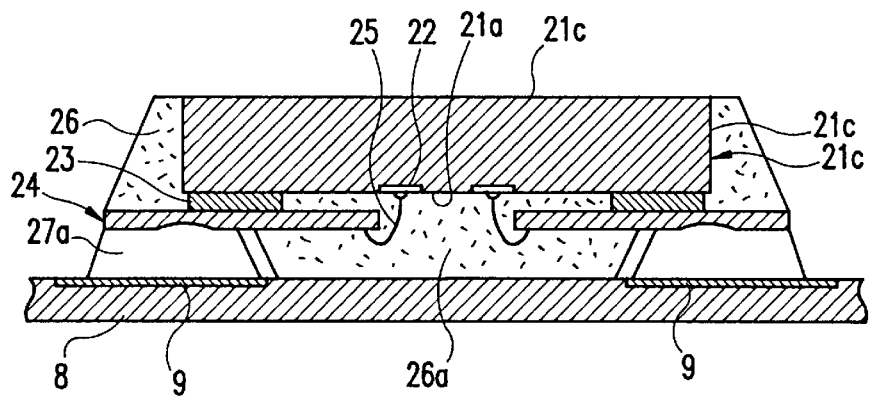
FIG. 1*c* is a sectional view showing a state of being packaged on the printed-circuit board.

FIG. 1c is a sectional view showing a state of how the resin sealing type semiconductor device in the first embodiment is soldered to a printed-circuit board. When packaging the resin sealing type semiconductor device on the printed-circuit board, flux for soldering is coated by screen printing etc over a foot print on a parts mounting surface of the printed-circuit board. Then, the semiconductor device is mounted so that the solder bump 27 is brought into contact with the foot print, which is put into a reflow device and is heated at approximately 300° C. The solder bump 27 is thus fused, and the semiconductor device is thereby soldered onto a printed-circuit board 8. In a soldered state, the protruded portion 26a of the sealing resin layer comes into contact with the printed-circuit board 8, and the lead 24 is electrically connected to a foot print (a circuit pattern) 9 on the printed-circuit board 8 through the solder bump 27a deformed due to the fusion. The semiconductor chip 21 is thereby connected to the external circuit via the solder bumps 27, the leads 24 and the boding wired 25, whereby signals are inputted and outputted to the external circuit.

Next, processes of manufacturing the resin sealing type semiconductor device in the first embodiment will be explained with reference to FIGS. 2a–2d. Thus semiconductor device is manufactured through processes (1)–(4) which follow.

Figure 2A:
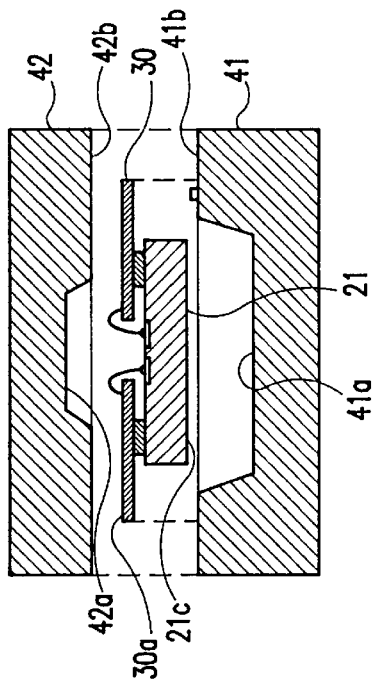
FIGS. 2*a*–2*d* are diagrams showing a method of manufacturing the resin sealing type semiconductor device in FIGS. 1*a*–1*c*.

(1) Process in FIG. 2a

To begin with, a lead frame 30 is produced by punching out a metal plate composed of a material such as Fe—Ni alloy etc and having a thickness of approximately 0.1 mm by use of a predetermined pattern. The lead frame 30 includes a frame member 31 and a lead portion 32 taking a comb-like shape extending inward from this frame member 31. The lead portion 32 assumes such a configuration that when the frame member 31 of the lead frame 30 is cut off, it is left in the form of the lead 24 as shown in FIGS. 1a–1c. Note that the frame member 31 is formed with a hole 31a for a positioning process simultaneously when punched out with the pattern.

Next, the recessed portion 24x is formed by etching in the area peripheral to each lead portion 32 on the side of the frame member 31 on one surface 30a of the lead frame 30. Then, the internal surface of the recessed portion 24x and a tip of the lead portion 32 are silver-plated 33 for soldering, thus manufacturing the lead frame 30 as shown in FIG. 2a.

Figure 2C:
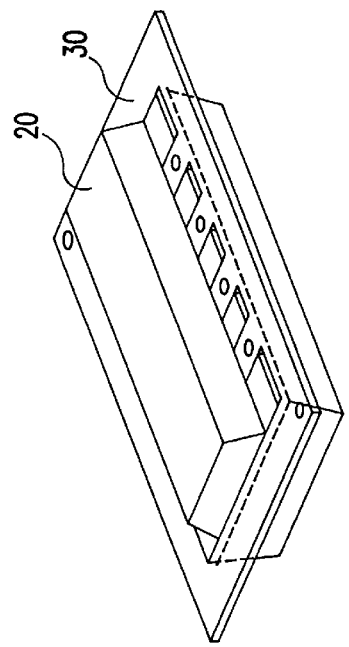
Figure 2B:
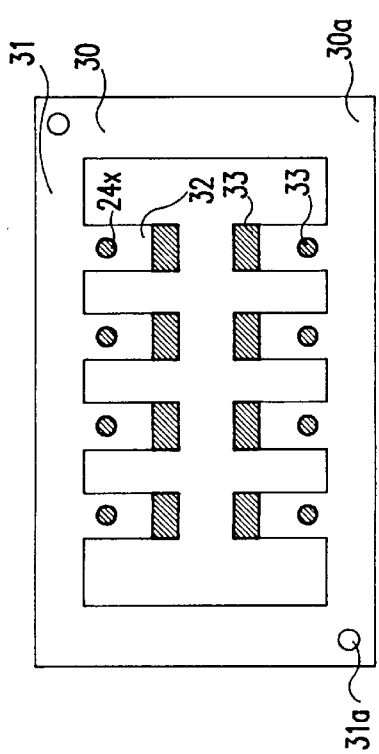

(2) Process in FIG. 2b

FIG. 2b is an explanatory assembly view showing how the semiconductor chip 21 is attached to the lead frame 30. The adhesive tape 23 is adhered to the lead portion 32 of a reverse surface 30b opposite to the surface 30a of the lead frame 30. Further, this adhesive tape 23 is thermally crimped to the circuit forming surface 21a of the semiconductor chip 21 at a temperature of approximately 400° C. After the lead frame 30 has been thus bonded to the semiconductor chip 21, the silver plating 33 at the tip of the lead portion 32 is electrically connected to the electrode 22 of the semiconductor chip 21 through the bonding wire 25.

(3) Process in FIG. 2c

FIG. 2c is an explanatory sectional view showing a mount state of the lead frame 30 into top and bottom molds 41, 42 for a molding process. The lead frame 30 fitted with the semiconductor chip is positioned by the hole 31a for a positioning process and mounted in a predetermined position within the top and bottom molds for the molding process. The bottom mold 41 is slightly wider in terms of its plane configuration than the circuit forming surface 21a of the semiconductor chip 21, and includes a cavity 41a taking substantially the same configuration. Then, a depth of the cavity 41a is set coincident with a dimension of a sum of thicknesses of the semiconductor chip 21 and of the adhesive tape 23. With this construction, when the semiconductor chip 21 is mounted into the bottom mold 41, the reverse surface 21c of the semiconductor chip 21 is closely fitted to the bottom surface of the cavity 41a of the bottom mold 41, with the result that the frame member 31 of the lead frame 30 is closely fitted to a base member 41b formed along the periphery of the cavity 41a.

Next, the top mold 42 paired with the bottom mold 41 is covered in a predetermined position of the bottom mold 41. The top mold 42 is formed with a cavity 42a having an aperture a width of which is narrower than the aperture of the cavity 41a of the bottom mold 41, and a plane base member 42 is formed along the periphery of the cavity 42a. A depth of the cavity 42a of the top mold 42 is set larger than a protrusion quantity of the bonding wire 25 from the surface 30a of the lead from 30. The top and bottom molds 41, 42 are matched by a predetermined pressure, at which time the reverse surface 21c of the semiconductor chip 21 to which the adhesive tape 23 is adhered comes into contact with the bottom surface of the cavity 41a of the bottom mold 41, and the lead portion 32 of the lead frame 30 comes into contact with the base member or of the top mold 42. Then, a bonding portion between the lead portion 32 and the adhesive tape 23 is fixed in a state of its being sandwiched in between the top and bottom molds 41, 42. Thus, the chip 21, to which the lead frame 30 is bonded, is mounted into the top and bottom molds 41, 42, and a mold resin such as epoxy resin molten into a liquid is poured from a gate into the cavities 41a, 42a.

Figure 2D:
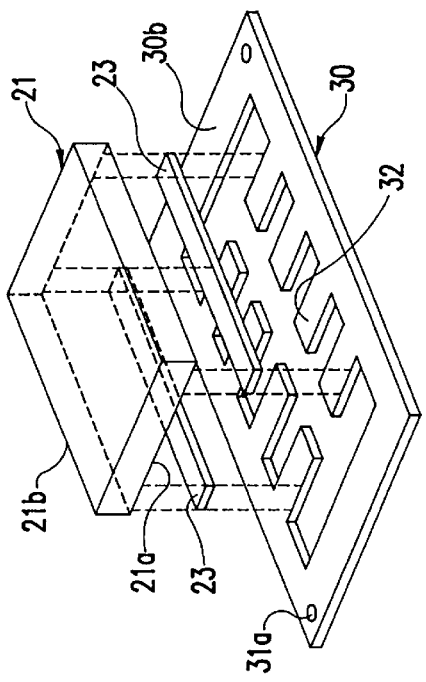

(4) Process in FIG. 2d

After the mold resin has been hardened, as illustrated in FIG. 2d, the semiconductor chip 21 molded by the sealing resin layer 26 is taken out, and an unnecessary portion of the lead frame 30 is cut off. Then, the flux for soldering is coated over the recessed portion 24x formed in the exposed surface 24c of the lead 24, and the solder ball having the diameter of approximately 0.5 mm is mounted thereon, wherein a reflow process is executed at, e.g., 240° C. The solder bump 27 is thereby formed in the recessed portion 24x, and the resin sealing type semiconductor device as shown in FIGS. 1a–1c is completed.

The resin sealing type semiconductor device in the first embodiment exhibits the following advantages (i)–(v) owing to the construction described above.

(i) The lead 24 takes the tabular band-like shape and has no stepped portion as in the prior art. Besides, the lead 24 is supported via the adhesive tape 23 on the semiconductor chip 21 kept in contact with the bottom mold 41 and therefore has no floating, and the exposed surface 24c of the lead 24 is closely fitted to the base member 42b of the top mold 42. Accordingly, the resin is hard to permeate between the top mold 42 and the exposed surface 24c, an occurrence of burr of the resin on the lead can be prevented.

(ii) When the semiconductor device is packaged on the printed-circuit board, the solder bump 27 for the connection between the printed-circuit board and the lead 24 has a comparatively large thickness, and hence there might be a dispersion of stress based on a change in temperature that is caused by a difference in thermal expansion coefficient between the printed-circuit board and the sealing resin layer 26, which eliminates a possibility of causing cracks in the solder bump 27.

(iii) The reverse surface 21c of the semiconductor chip 21 is formed with no sealing resin layer 26 but is in an exposed state, and therefore a heat radiation property is provided.

(iv) The lead 24 takes the tabular band-like shape and has no stepped portion, so that the lead frame 30 is easy to manufacture.

(v) The resin burr is hard to occur on the exposed surface 24c of the lead 24, which eliminates the necessity for the step of removing the resin burr. The metal plating for solder that is effected on the recessed portion 24x of the external connecting portion 24b and the metal plating for wire bonding that is effected on the electrode connecting portion 24a, can be performed by using the same material simultaneously when manufacturing the lead frame 30.

Figure 3A:
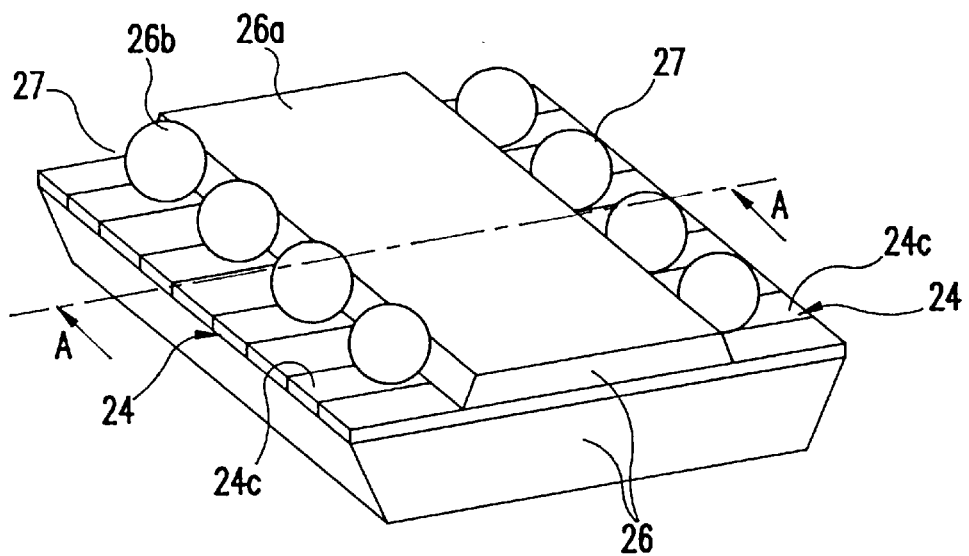
FIG. 3*a* is a perspective view illustrating the resin sealing type semiconductor device in a second embodiment of the present invention.
Figure 3B:
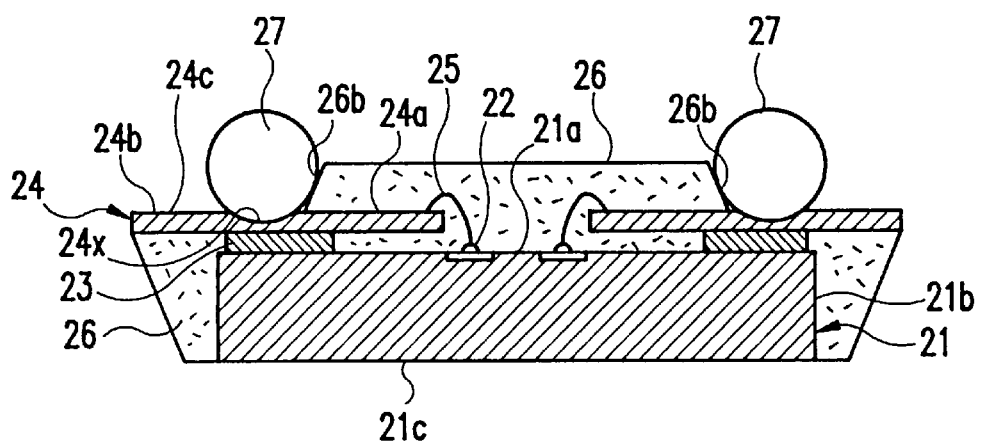
FIG. 3*b* is a view showing a part of section taken along the line A—A in FIG. 3*a*.

FIGS. 3a and 3b are sectional views illustrating a second embodiment of the resin sealing type semiconductor device according to the present invention. FIG. 3a is a perspective view of the whole. FIG. 3b is a sectional view taken along the line A—A in FIG. 3a, showing only the right part in FIG. 3a. In the semiconductor device in the second embodiment, the stepped portion 26b of the sealing resin layer 26 is formed in a substantially planar shape, and the solder bump 27 is fixed onto the exposed surface 24c of the lead 24 in a state of being in contact with the stepped portion 26b. The construction of the semiconductor device in the second embodiment is the same as that in the first embodiment except for the fixing position of the solder bump 27. Though an illustration is omitted, in the semiconductor device in accordance with the second embodiment too, the solder bumps 27 are rectilinearly arranged in two lines along the stepped portion 26b.

When forming the solder bumps 27 respectively on the plurality of leads 24, and if trying to form the solder bumps 27 on middle portions of the exposed surfaces 24c of the leads 24, it is difficult to position the solder bumps 27 in order to attain the rectilinear arrangement of the solder bumps 27. As in the second embodiment, when the solder bumps 27 are arranged along the stepped portion 26b, the solder bumps 27 can be easily rectilinearly arranged.

Figure 4:
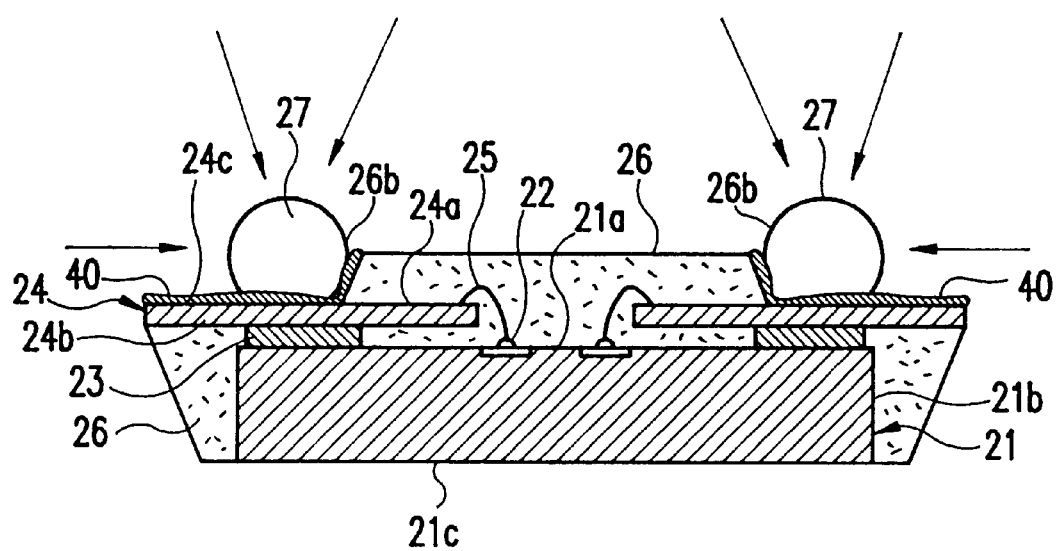
FIG. 4 is a sectional view showing a modified example of the device in FIGS. 3*a*–3*b*.

Further, at a stage before the solder is fixed by the reflow process, the solder ball is disposed on the liquid flux coated over the exposed surface 24c of the lead 24, and therefore, if the solder balls are disposed on the middle portions of the exposed surfaces 24c, the solder balls are easy to move, with the result that it is impossible to rectilinearly arrange and fix the plurality of solder bumps 27. In contrast with this arrangement, if the solder bumps 27 are, as in the second embodiment, arranged along the stepped portion 26b, before the solder bumps 27 are fixed, a flux 40 is coated over not only the exposed surfaces of the leads 24 but also the stepped portion 26b of the sealing resin layer 26, whereby the solder bumps 27 are, as shown in FIG. 4, pulled in to positions contiguous to the stepped portion 26b by dint of a surface tension (acting in an arrowed direction in the Figure) of the liquid flux 40 enough to prevent movements of the solder balls before the reflow process. Incidentally, referring to FIG. 4, the flux 40 is illustrated thicker with an exaggeration than an actual dimension.

Figure 5A:
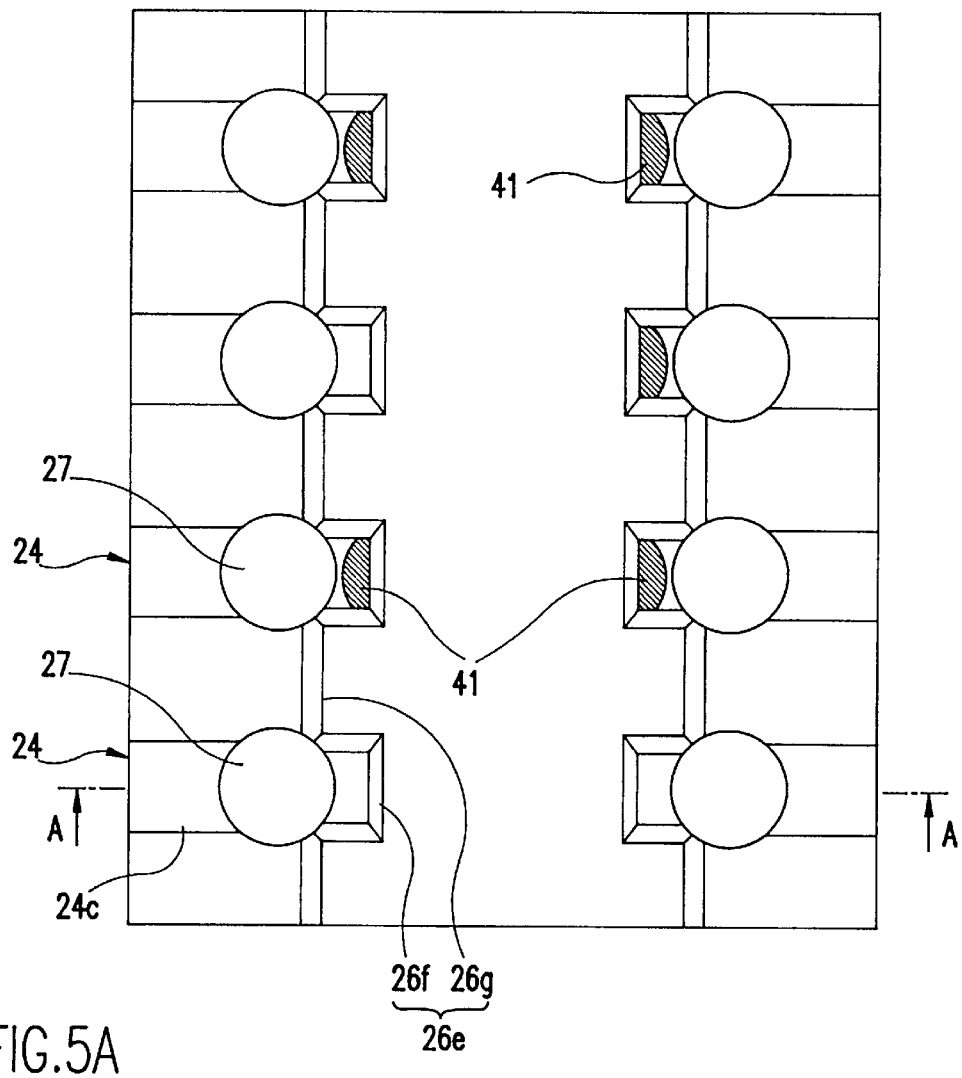
FIG. 5*a* is a plan view showing some portions of the resin sealing type semiconductor device in a third embodiment.
Figure 5B:
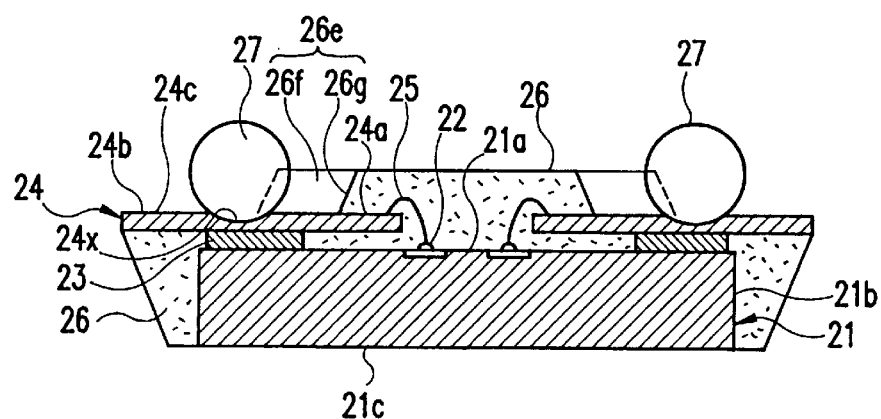
FIG. 5*b* is a sectional view taken along the line A—A in FIG. 5*a*.
Figure 6A:
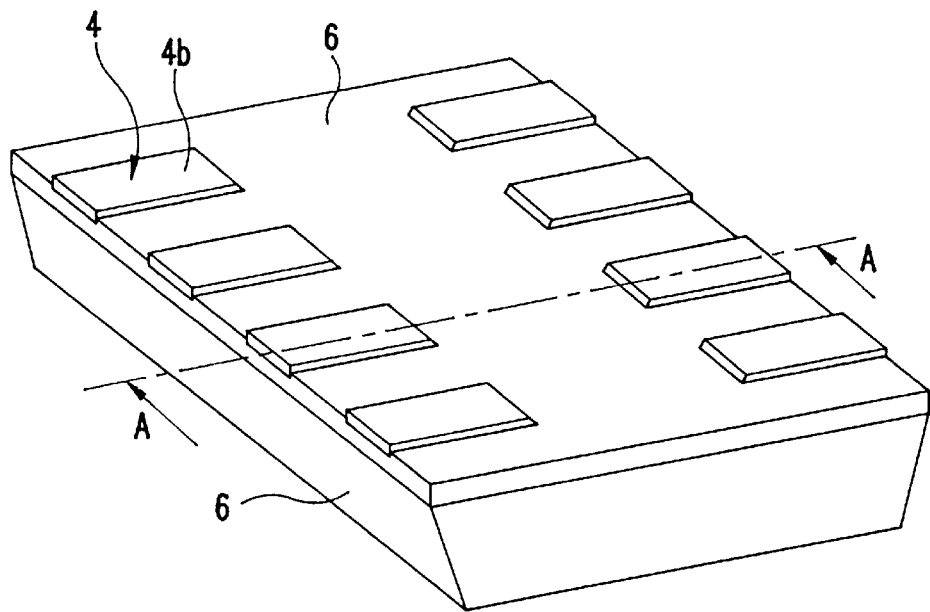
FIG. 6*a* is a perspective view illustrating a prior art resin sealing type semiconductor device.
Figure 6B:
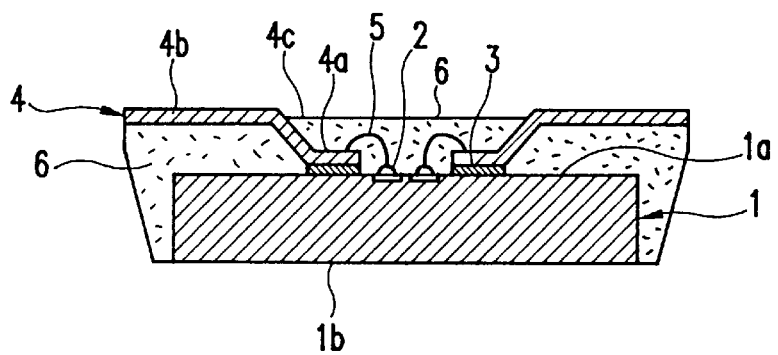
FIG. 6*b* is a sectional view taken along the line A—A in FIG. 6*b*.
Figure 7A:
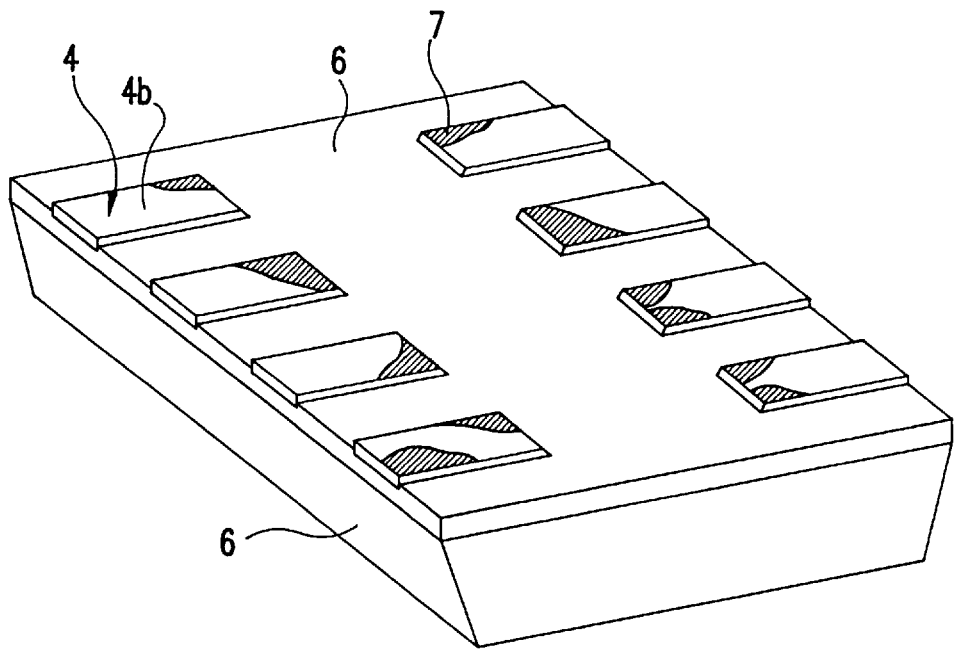
FIG. 7*a* is a perspective view showing a first problem inherent in the prior art resin sealing type semiconductor device.
Figure 7B:
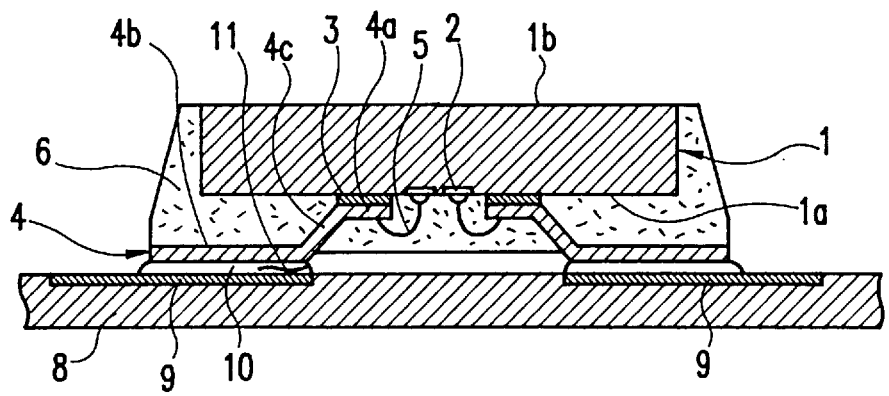
FIG. 7*b* is a sectional view when packaged, showing a second problem inherent in the prior art resin sealing type semiconductor device.

FIGS. 5a and 5b show a third embodiment of the resin sealing type semiconductor device according to the present invention. FIG. 5a is a plan view. FIG. 5b is a sectional view taken along the line A—A in FIG. 5a. In the semiconductor device in the third embodiment, stepped portions 26e of the sealing resin layer 26 are, as illustrated in FIG. 5a, formed in such a configuration as to provide a repetitive layout of recessed portions 26f and protruded portions 26g so that areas covering the leads 24 recede toward the central side (a left side in the Figure) of the circuit forming surface 21a from other areas. The solder bump 27 is fixed in such a position as to come into the contact with angular portions of the protruded portions 26 on both sides in a state of being fitted into a part of the recessed portion 26f.

According to the construction of the third embodiment, the plurality of solder bumps 27 can be precisely rectilinearly arranged and fixed. Note that the respective embodiments discussed above have a smaller possibility of causing the resin burr than in the prior arts, however, it might happen that the resin burr is produced due to some inconvenience of being mounted into the molds. There is a high probability that the resin burr is produced in close proximity to the sealing resin layer 26 of the lead 24, and hence, as in the second embodiment, if the solder bump 27 is fixed in contact with the stepped portion 26b, there might be a possibility in which the resin burr hinders the fixation of the solder bump 27. In accordance with the third embodiment, since the recessed portion 26f is formed in the portion covering the lead 24, even if a resin burr 41 is produced, a possibility of this resin burr 41 reaching the fixing position of the solder bump 27, is small. If the resin burr 41 is produced on the lead 24 too, the solder bump 27 can be fixed without going through the step of removing the resin burr 41.

Note that the present invention is not limited to the embodiments discussed above and can be modified in a variety of forms. Given hereinbelow are such modifications as shown by the following items (a)–(f).

(a) The resin sealing type semiconductor device in each embodiment includes totally eight pieces of the electrodes 22 formed on the semiconductor chip 21, and eight pieces of leads 24. The numbers of the electrodes 22 and of the leads 24 corresponding thereto are not limited to 8, and there may be provided necessary numbers of the electrodes 22 and of the leads 24 corresponding to a scale of the circuit contained in the semiconductor chip. Further, the areas where the leads are provided are not confined to two sides of the periphery of the circuit forming surface 21a as shown in each embodiment but may extend to four sides of the periphery thereof.

(b) As the bonding layer, a substitute for the adhesive tape 23 as used in the respective embodiments may involve fixing the leads 24 onto the semiconductor chip 21 by coating a bonding agent exhibiting an insulating property in a predetermined thickness.

(c) As the connecting member for electrically connecting the electrode 22 to the lead 24, a substitute for the bonding wire 25 as used in the respective embodiments may also involve the use of a bonding agent having a conductivity.

(d) FIGS. 2a–2c shows one example of the method of manufacturing the resin sealing type semiconductor device in the first embodiment. The method of manufacturing the resin sealing type semiconductor device according to the present invention is not, however, limited to the above manufacturing method. For example, the method is not that the lead frame 30 is manufactured by punching out the metal plate but that the leads 24 manufactured as individual parts from the beginning may be individually or bundled by a paper tape and bonded to the semiconductor chip 21.

(e) The materials of the adhesive tape 23, the lead 24 and the bonding wire 25 are not confined to the materials described above, and proper materials may be selected in consideration of the manufacturing methods and the costs as well.

(f) In each of the embodiments, the reverse surface 21c of the semiconductor chip 21 is in the exposed state without being covered with the sealing resin layer 26. If an electrical insulation is needed, however, the reverse surface 21c may be covered with the sealing resin layer 26.

As discussed above, according to the present invention, the lead takes the tabular band-like shape with no stepped portion unlike the prior art, and therefore the lead frame is easy to manufacture. Besides, since a distance between the lead and the semiconductor chip does not change depending on the positions of the respective portions within the lead, it is easy to firmly fix the lead to the semiconductor chip, and the adhesion between the exposed surface of the lead and the mold is enhanced, whereby the occurrence of the resin burr can be readily avoided. Moreover, the bump is provided higher than the protruded portion of the sealing resin layer, and therefore has the larger thickness than in the prior art. Then, there is dispersed the stress due to the change in temperature after being packaged on the printed-circuit board, and it is feasible to restrain the cracks from being produced in the bumps.

Furthermore, the reverse surface of the semiconductor chip that is opposite to the circuit forming surface is not covered with the sealing resin layer and is exposed to the outside, in which case the heat evolved on the semiconductor chip can be readily radiated. Further, in this case, the semiconductor comes into contact with the bottom surface of one mold when mounted into the molds, and hence the leads bonded to the circuit forming surface can be supported more surely, thereby making it feasible to prevent the resin from permeating between the other mold and the exposed surface of the lead.

Note that the bumps may be, when fixed, disposed along the protruded portion of the sealing resin layer, which facilitates the positioning process of each bump and makes it possible to readily rectilinearly arrange the plurality of bumps. On this occasion, if the area of the stepped portion that covers the lead is so formed as to recede toward the central side of the circuit forming surface from other areas, the area in which the resin burr tends to occur can be set apart from the bump fixing portion. Even if the resin burr is produced, the bump can be fixed without removing the burr.

It is apparent that, in this invention, a wide range of different working modes can be formed based on the invention without deviating from the spirit and scope of the invention. This invention is not restricted by its specific working modes except being limited by the appended claims.

What is claimed is:

1. A resin sealing type semiconductor device comprising:
   a semiconductor chip having a plurality of electrodes formed at a circuit forming surface;

a plurality of leads fixed over the chip, each lead having a first end for electrically connecting the electrodes and a second end;

a sealing resin to cover said first end of the leads and said electrodes, while leaving said second end of the leads uncovered;

a plurality of bumps formed on said second end of the leads.

2. A resin sealing type semiconductor device according to claim 1, wherein said second ends of said leads are formed with a recessed portion into which said bump is fixed, and an internal surface of said recessed portion is subjected to metal plating for soldering.

3. A resin sealing type semiconductor device according to claim 1, wherein said leads are fixed on the semiconductor chip by an adhesive tape.

4. A resin sealing type semiconductor device according to claim 1, wherein respective leads and electrodes are connected by wire.

5. A resin sealing type semiconductor device according to claim 1, wherein a side surface of the semiconductor chip is sealed by the resin.

6. A resin sealing type semiconductor device according to claim 1, wherein said leads are disposed in parallel to each other.

7. A resin sealing type semiconductor device comprising:

a semiconductor chip including a plurality of electrodes formed at a central portion of a circuit forming surface;

a plurality of leads bonded to said circuit forming surface by a bonding layer having an insulating property, and disposed in a state of being parallel to said circuit forming surface such that their one ends serving as electrode connecting portions are located at the central portion of said circuit forming surface and their other ends serving as external connecting portions are located at an outer edge of said circuit forming surface;

a connector which electrically connects said electrode connecting portions of said plurality of leads to said plurality of electrodes;

a sealing resin layer covering part of said plurality of leads, said circuit forming surface and said connector in such a state that exposed surfaces of said external connecting portions which are opposite to said circuit forming surface are exposed to the outside, and including protruded portions each protruded by one step from said exposed surface at the central portion of said circuit forming surface; and a bump formed on each of said exposed surfaces.

8. A resin sealing type semiconductor device according to claim 7, wherein said bonding layer is an adhesive tape having an insulating property, and said connector is a bonding wire.

9. A resin sealing type semiconductor device according to claim 7, wherein said exposed surface of said external connecting portion is formed with a recessed portion into which said bump is fixed, and an internal surface of said recessed portion is subjected to metal plating for soldering.

10. A resin sealing type semiconductor device according to claim 7, wherein each bump is formed on said exposed surface at a height higher by a fixed dimension than said protruded portion.

11. A resin sealing type semiconductor device according to claim 7, wherein a reverse surface of said semiconductor chip that is opposite to said circuit forming surface, is exposed to the outside without being covered with said sealing resin layer.

12. A resin sealing type semiconductor device according to claim 11, wherein said bumps are rectilinearly arranged along a stepped portion defined as a rising portion from said exposed surface of said protruded portion.

13. A resin sealing type semiconductor device according to claim 11, wherein said bumps are so disposed as to be contiguous to said stepped portion.

14. A resin sealing type semiconductor device according to claim 13, wherein said stepped portion of said sealing resin layer is formed in a substantially plane shape.

15. A resin sealing type semiconductor device according to claim 13, wherein said stepped portion of said sealing resin layer is formed in such a configuration as to provide a repetitive layout of recessed and protruded portions so that areas of said stepped portions which cover said plurality of leads recede toward the central side of said circuit forming surface from other areas.

16. A resin sealing type semiconductor device comprising:

a semiconductor chip including a plurality of electrodes formed at a central portion of a circuit forming surface;

a plurality of tabular band-like leads electrically connected respectively to said plurality of electrodes, and disposed in a state of being substantially parallel to said circuit forming surface;

a sealing resin layer formed so as to cover some portions of said plurality of respective leads and said circuit forming surface, and including protruded portions each so formed as to protrude by one step from said leads at the central portion of said circuit forming surface and surfaces at ends of said leads away from the central portion remaining exposed; and a plurality of bumps formed respectively on exposed surfaces of said leads that are exposed from said sealing resin layer.

17. A resin sealing type semiconductor device according to claim 16, wherein each bump is formed on said exposed surface at a height higher by a fixed dimension than said protruded portion.

18. A resin sealing type semiconductor device according to claim 16, wherein a reverse surface of said semiconductor chip that is opposite to said circuit forming surface, is exposed to the outside without being covered with said sealing resin layer.

19. A resin sealing type semiconductor device according to claim 16, wherein said bumps are rectilinearly arranged along a stepped portion defined as a rising portion from said exposed surface of said protruded portion.

20. A resin sealing type semiconductor device according to claim 19, wherein said bumps are so disposed as to be contiguous to said stepped portion.

21. A resin sealing type semiconductor device according to claim 20, wherein said stepped portion of said sealing resin layer is formed in a substantially plane shape.

22. A resin sealing type semiconductor device according to claim 20, wherein said stepped portion of said sealing resin layer is formed in such a configuration as to provide a repetitive layout of recessed and protruded portions so that areas of said stepped portions which cover said plurality of leads recede toward the central side of said circuit forming surface from other areas.

23. A resin sealing type semiconductor device fixed on a printed-circuit board, comprising:

a semiconductor chip including a plurality of electrodes formed at a central portion of a circuit forming surface facing said printed-circuit board;

a plurality of tabular band-like leads electrically connected respectively to said plurality of electrodes, and disposed in a state of being substantially parallel to said circuit forming surface;

a sealing resin layer formed so as to cover some portions of said plurality of respective leads and said circuit forming surface, and including protruded portions each so formed as to be contiguous to said printed-circuit board while protruding by one step from said leads at the central portion of said circuit forming surface and surfaces at ends of said leads away from the central portion remaining exposed; and a plurality of bumps for respectively connecting exposed surfaces of said leads that are exposed from said sealing resin layer to circuit patterns of said printed-circuit board.

24. A resin sealing type semiconductor device according to claim 23, wherein said leads are bonded to said circuit forming surface through bonding layers exhibiting an insulating property so that their one ends serving as electrode connecting portions are located at the central portion of said circuit forming surface and that their other ends serving as external connecting portions are located at an outer edge of said circuit forming surface.

* * * * *